US007671517B2

(12) United States Patent
Ishimasa et al.

(10) Patent No.: US 7,671,517 B2
(45) Date of Patent: Mar. 2, 2010

(54) PIEZOELECTRIC ELECTROACOUSTIC TRANSDUCER

(75) Inventors: Mitsunori Ishimasa, Toyama (JP); Keiichi Kami, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 881 days.

(21) Appl. No.: 10/596,718

(22) PCT Filed: Oct. 20, 2004

(86) PCT No.: PCT/JP2004/015476

§ 371 (c)(1),
(2), (4) Date: Jun. 22, 2006

(87) PCT Pub. No.: WO2005/064989

PCT Pub. Date: Jul. 14, 2005

(65) Prior Publication Data

US 2009/0015108 A1 Jan. 15, 2009

(30) Foreign Application Priority Data

Dec. 25, 2003 (JP) ............................ 2003-429670

(51) Int. Cl.
*H01L 41/053* (2006.01)

(52) U.S. Cl. ........................ 310/353; 310/330; 310/348

(58) Field of Classification Search ................. 310/353, 310/330
See application file for complete search history.

(56) References Cited

U.S. PATENT DOCUMENTS 5,196,754 A 3/1993 Berthold et al.
6,396,201 B1 * 5/2002 Ide et al. ..................... 310/353
6,744,180 B2 * 6/2004 Nakamura et al. .......... 310/348
6,894,423 B2 * 5/2005 Takeshima et al. .......... 310/324
2001/0004180 A1 * 6/2001 Kishimoto .................. 310/324
2002/0134155 A1 * 9/2002 Ishitoko et al. ........... 73/504.12

(Continued)

FOREIGN PATENT DOCUMENTS

JP 05-268696 A 10/1993

(Continued)

OTHER PUBLICATIONS

Official Communication issued in the corresponding International Application No. PCT/JP2004/015476, mailed on Feb. 1, 2005.

*Primary Examiner*—Walter Benson
*Assistant Examiner*—Bryan P Gordon
(74) *Attorney, Agent, or Firm*—Keating & Bennett, LLP

(57) ABSTRACT

A piezoelectric electroacoustic transducer includes a substantially rectangular piezoelectric diaphragm, a case having supports to support the four corners of the bottom surface of the piezoelectric diaphragm, terminals fixed to the case, each including an inner connection portion exposed near the supports, a first elastic adhesive disposed between the periphery of the piezoelectric diaphragm and the terminals, a conductive adhesive disposed between electrodes of the piezoelectric diaphragm and the terminals across the top surface of the first elastic adhesive, a second elastic adhesive filling and sealing a gap between the periphery of the piezoelectric diaphragm and an inner portion of the case, and an overamplitude-preventing receiver provided on a bottom wall of the case to limit the amplitude of vibration of the piezoelectric diaphragm to a predetermined range. The overamplitude-preventing receiver is disposed closer to the center of the piezoelectric diaphragm than the supports.

13 Claims, 7 Drawing Sheets

U.S. PATENT DOCUMENTS

| | | | | |
|---|---|---|---|---|
| 2002/0195901 | A1* | 12/2002 | Takeshima et al. | 310/324 |
| 2003/0011282 | A1 | 1/2003 | Kishimoto | |
| 2003/0034714 | A1* | 2/2003 | Takeshima et al. | 310/324 |
| 2003/0107300 | A1* | 6/2003 | Nakamura et al. | 310/324 |
| 2004/0124748 | A1* | 7/2004 | Takeshima et al. | 310/331 |
| 2004/0201326 | A1* | 10/2004 | Yokoi et al. | 310/348 |
| 2004/0205949 | A1* | 10/2004 | Takeshima et al. | 29/25.35 |

FOREIGN PATENT DOCUMENTS

| | | | |
|---|---|---|---|
| JP | 07-016500 | U | 3/1995 |
| JP | 10-168396 | A | 6/1998 |
| JP | 2001-095094 | A | 4/2001 |
| JP | 2001-238291 | A | 8/2001 |
| JP | 2003-009286 | A | 1/2003 |
| JP | 2003-023696 | A | 1/2003 |
| JP | 2003-125490 | A | 4/2003 |

* cited by examiner

PIEZOELECTRIC ELECTROACOUSTIC TRANSDUCER

BACKGROUND OF THE INVENTION

1. Field of the Invention

The present invention relates to piezoelectric electroacoustic transducers such as piezoelectric sounders, piezoelectric receivers, and piezoelectric speakers.

2. Description of the Related Art

Piezoelectric electroacoustic transducers for emitting warning sounds or operating sounds have been widely used in electronic devices, consumer products, and cellular phones, for example, as piezoelectric sounders or piezoelectric receivers. Piezoelectric electroacoustic transducers incorporating a rectangular diaphragm have been proposed to achieve higher production efficiency, higher electroacoustic conversion efficiency, and size reduction.

Extremely thin diaphragms, on the order of tens to hundreds of micrometers in thickness, have recently been used for lower frequencies. The frequency characteristics of such thin diaphragms are greatly affected by the structures that support the diaphragms.

If, for example, a diaphragm is directly connected to terminals fixed to a casing using a thermosetting conductive adhesive, a stress due to the curing and contraction of the conductive adhesive causes a strain on the diaphragm. This strain results in variations in the frequency characteristics of the diaphragm. In addition, the cured conductive adhesive can disadvantageously obstruct the vibration of the diaphragm or, conversely, can be cracked by the vibration thereof because the cured adhesive has a relatively high Young's modulus.

Japanese Unexamined Patent Application Publication No. 2003-9286 proposes a piezoelectric electroacoustic transducer including a piezoelectric diaphragm, a casing having a support on an inner portion thereof to support the bottom surface of the piezoelectric diaphragm at two or four sides thereof, terminals having inner connection portions exposed near the support, a first elastic adhesive applied between the periphery of the piezoelectric diaphragm and the inner connection portions of the terminals to fix the piezoelectric diaphragm to the casing, a conductive adhesive applied between electrodes of the piezoelectric diaphragm and the inner connection portions of the terminals across the top surface of the first elastic adhesive to electrically connect the electrodes of the piezoelectric diaphragm to the inner connection portions of the terminals, and a second elastic adhesive provided to seal a gap between the periphery of the piezoelectric diaphragm and the inner portion of the casing. The first elastic adhesive is, for example, a urethane adhesive. The second elastic adhesive is a material with a lower Young's modulus than the first elastic adhesive, for example, a silicone adhesive.

In this case, the elasticity of the first elastic adhesive prevents, for example, variations in the frequency characteristics of the diaphragm which are caused by a stress due to the curing and contraction of the conductive adhesive and the cracking of the cured conductive adhesive. However, the support may restrain the piezoelectric diaphragm and obstruct the bending vibration thereof because the support supports the piezoelectric diaphragm at two or four sides thereof.

Japanese Unexamined Patent Application Publication No. 2003-23696 discloses a piezoelectric electroacoustic transducer including a piezoelectric diaphragm, a casing having supports for supporting the bottom surface of the piezoelectric diaphragm at the four corners thereof, a first elastic adhesive applied between the piezoelectric diaphragm and terminals near the supports, and a conductive adhesive applied across the first elastic adhesive to electrically connect the piezoelectric diaphragm to the terminals.

In this case, the supports have a small supporting area because they support only the corners of the piezoelectric diaphragm. This electroacoustic transducer can produce a higher sound pressure without restraining the diaphragm.

A piezoelectric electroacoustic transducer having supports for supporting a piezoelectric diaphragm at the corners thereof can thus produce a higher sound pressure. A smaller diaphragm-supporting area is required for further size reduction and still higher sound pressures, and a smaller diaphragm thickness is required for lower frequencies. A thinner diaphragm, however, bends more easily, and an impact, for example, can cause a large curvature of the diaphragm if the supporting area is reduced. A large curvature of the diaphragm causes a large amplitude of vibration thereof in the vicinity of the conductive adhesive, and accordingly, an excessive stress acts on the conductive adhesive. The excessive stress can disadvantageously contribute to the cracking of the conductive adhesive, thus degrading the connection reliability.

FIGS. 14A and 14B illustrate sectional views of a support supporting a piezoelectric diaphragm according to the known art.

In FIG. 14A, a support 32 supports a corner of a diaphragm 30. An elastic adhesive 34 is applied between the diaphragm 30 and a terminal 33 that is inserted in a case 33. The elastic adhesive 34 is, for example, a urethane adhesive. A conductive adhesive 35 is applied across the elastic adhesive 34 to electrically connect an electrode of the diaphragm 30 to the terminal 33.

In this support structure, the diaphragm 30 bends downward with the support 32 acting as a fulcrum if an impact, for example, applies a downward acceleration G to the diaphragm 30, as shown in FIG. 14B. The downward bending imposes a tensile stress on the conductive adhesive 35 and causes a crack.

Japanese Unexamined Utility Model Registration Application Publication No. 7-16500 discloses a piezoelectric sounder including a unimorph piezoelectric diaphragm and a case having curvature-preventing columns extending from the bottom surface thereof. The curvature-preventing columns limit the curvature of the piezoelectric diaphragm if an impact, for example, applies an external force exceeding the bending strength of the diaphragm. However, the curvature-preventing columns are intended to prevent the cracking of the piezoelectric diaphragm itself and the delamination of a ceramic plate from a metal plate, and no consideration is given to the cracking of a conductive adhesive as described above.

SUMMARY OF THE INVENTION

To overcome the problems described above, preferred embodiments of the present invention provide a piezoelectric electroacoustic transducer that prevents an excessive curvature of a piezoelectric diaphragm due to, for example, an impact, so as to prevent the cracking of a conductive adhesive.

A preferred embodiment of the present invention provides a piezoelectric electroacoustic transducer including a piezoelectric diaphragm that is supplied with a periodic signal across electrodes thereof to bend and vibrate in a thickness direction, a casing having supports on an inner portion thereof to support the four corners of the bottom surface of the piezoelectric diaphragm, terminals fixed to the casing, each having an inner connection portion exposed near the supports, a first elastic adhesive applied between the periphery of the piezoelectric diaphragm and the inner connection portions of the terminals to secure the piezoelectric diaphragm to the casing, a conductive adhesive applied between the electrodes of the piezoelectric diaphragm and the inner connection portions of the terminals across the top surface of the first elastic adhesive to electrically connect the electrodes of the piezoelectric diaphragm to the inner connection portions of the terminals, a second elastic adhesive filling and sealing a gap between the periphery of the piezoelectric diaphragm and the inner portion of the casing, and an overamplitude-preventing receiver disposed on the casing to limit the amplitude of vibration of the piezoelectric diaphragm to a predetermined range. The overamplitude-preventing receiver is disposed closer to the center of the piezoelectric diaphragm than to the supports. The second elastic adhesive fills a gap between the bottom surface of the piezoelectric diaphragm and the top surface of the overamplitude-preventing receiver.

The supports are provided on the inner portion of the casing to support and hold the four corners of the bottom surface of the piezoelectric diaphragm without excessively restraining the diaphragm. The piezoelectric diaphragm is more easily displaced to produce a higher sound pressure because the supports support only the corners of the piezoelectric diaphragm. However, an impact can bend the piezoelectric diaphragm with a large curvature and thus crack the conductive adhesive, which connects the electrodes of the piezoelectric diaphragm to the inner connection portions of the terminals.

In various preferred embodiments of the present invention, the overamplitude-preventing receiver is located closer to the center of the piezoelectric diaphragm than to the supports to limit the amplitude of vibration of the piezoelectric diaphragm to a predetermined range. In addition, the second elastic adhesive fills the gap between the bottom surface of the piezoelectric diaphragm and the top surface of the overamplitude-preventing receiver to softly support the bottom surface of the piezoelectric diaphragm when the diaphragm is bent. Thus, the second elastic adhesive eliminates problems, such as cracking, which are caused by impacts.

The distance between the bottom surface of the piezoelectric diaphragm and the top surface of the overamplitude-preventing receiver is preferably about 0.01 mm to about 0.2 mm.

If the distance exceeds about 0.2 mm, the electroacoustic transducer cannot prevent the overamplitude vibration of the piezoelectric diaphragm, and thus, for example, the conductive adhesive is more likely to crack. If the distance is less than about 0.01 mm, the second elastic adhesive has a small thickness between the piezoelectric diaphragm and the overamplitude-preventing receiver. As a result, the overamplitude-preventing receiver tends to obstruct the displacement of the piezoelectric diaphragm and thus, decreases sound pressure.

Preferably, the first elastic adhesive preferably has a Young's modulus of about $500\times10^6$ Pa or less after being cured, and the second elastic adhesive preferably has a Young's modulus of about $30\times10^6$ Pa or less after being cured.

That is, the first and second elastic adhesives have Young's moduli after being cured such that they have no significant effect on the displacement of the diaphragm. The displacement of the diaphragm is at least about 90% of the maximum displacement thereof if the first and second elastic adhesives have Young's moduli of about $500\times10^6$ Pa or less and about $30\times10^6$ Pa or less, respectively, after being cured. Thus, the first and second elastic adhesives have no significant effect on the displacement of the diaphragm.

The Young's modulus of the second elastic adhesive is limited to a narrower acceptable range because the operation of the piezoelectric diaphragm is more susceptible to the Young's modulus of the second elastic adhesive. The second elastic adhesive is applied to the periphery of the piezoelectric diaphragm while the first elastic adhesive is partially applied to the piezoelectric diaphragm, for example, only around the corners thereof.

The first elastic adhesive is preferably a urethane adhesive, and the second elastic adhesive is preferably a silicone adhesive, for example.

Silicone adhesives are widely used as elastic adhesives because of the low Young's modulus after curing and the low cost. These adhesives, however, can produce siloxane gas and deposit a coating thereof on, for example, connection portions when cured by heating. This coating causes serious problems, such as bonding failure and connection failure, when a conductive adhesive is applied. Silicone adhesives are therefore used only after a conductive adhesive is applied and cured. Urethane adhesives, by contrast, avoid the problems associated with the use of silicone adhesives.

Accordingly, a urethane adhesive is preferably used as the first elastic adhesive to secure the piezoelectric diaphragm to the casing and to form a layer underlying the conductive adhesive for electrically connecting the electrodes of the piezoelectric diaphragm to the inner connection portions of the terminals. On the other hand, a silicone adhesive is preferably used as the second elastic adhesive to seal the periphery of the piezoelectric diaphragm. Therefore, the piezoelectric electroacoustic transducer achieves excellent vibration characteristics without causing bonding failure or connection failure.

According to preferred embodiments of the present invention, the supports are provided on the inner portion of the casing to support and hold the four corners of the bottom surface of the piezoelectric diaphragm, thereby producing a higher sound pressure. Even if an impact, for example, significantly bends the piezoelectric diaphragm, the overamplitude-preventing receiver provided on the casing supports the piezoelectric diaphragm so as to prevent cracking of the conductive adhesive.

Furthermore, the second elastic adhesive fills the gap between the bottom surface of the piezoelectric diaphragm and the top surface of the overamplitude-preventing receiver. The second elastic adhesive softly supports the bottom surface of the piezoelectric diaphragm when the diaphragm is bent, such that no impact acts on the piezoelectric diaphragm.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described.

First Preferred Embodiment

Figure 1:
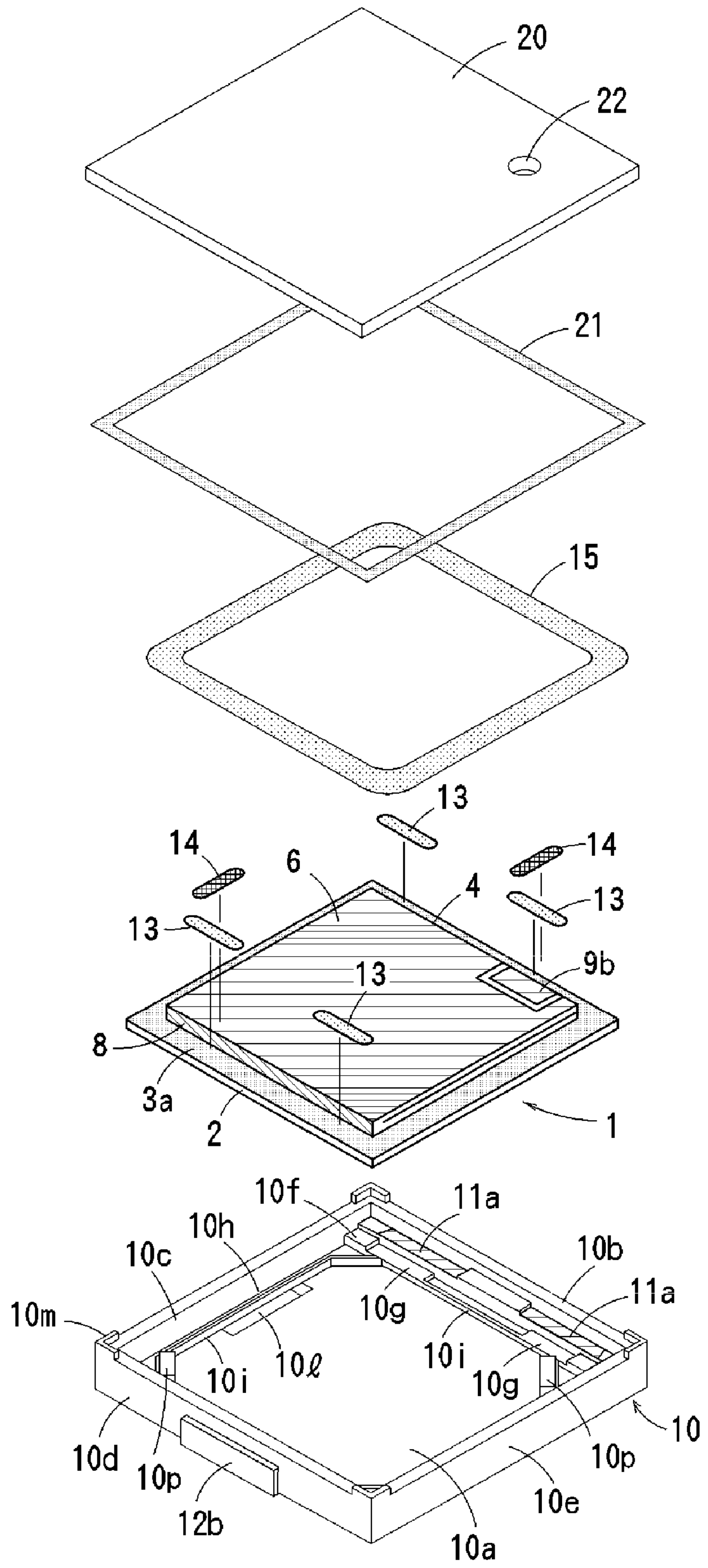
FIG. 1 is an exploded perspective view of a piezoelectric electroacoustic transducer according to a first preferred embodiment of the present invention.

FIG. 1 illustrates a piezoelectric sounder as an example of a surface-mount piezoelectric electroacoustic transducer according to preferred embodiments of the present invention.

This piezoelectric sounder primarily includes a piezoelectric diaphragm 1, a case 10, and a cover 20. The case 10 and the cover 20 define a casing.

Figure 2:
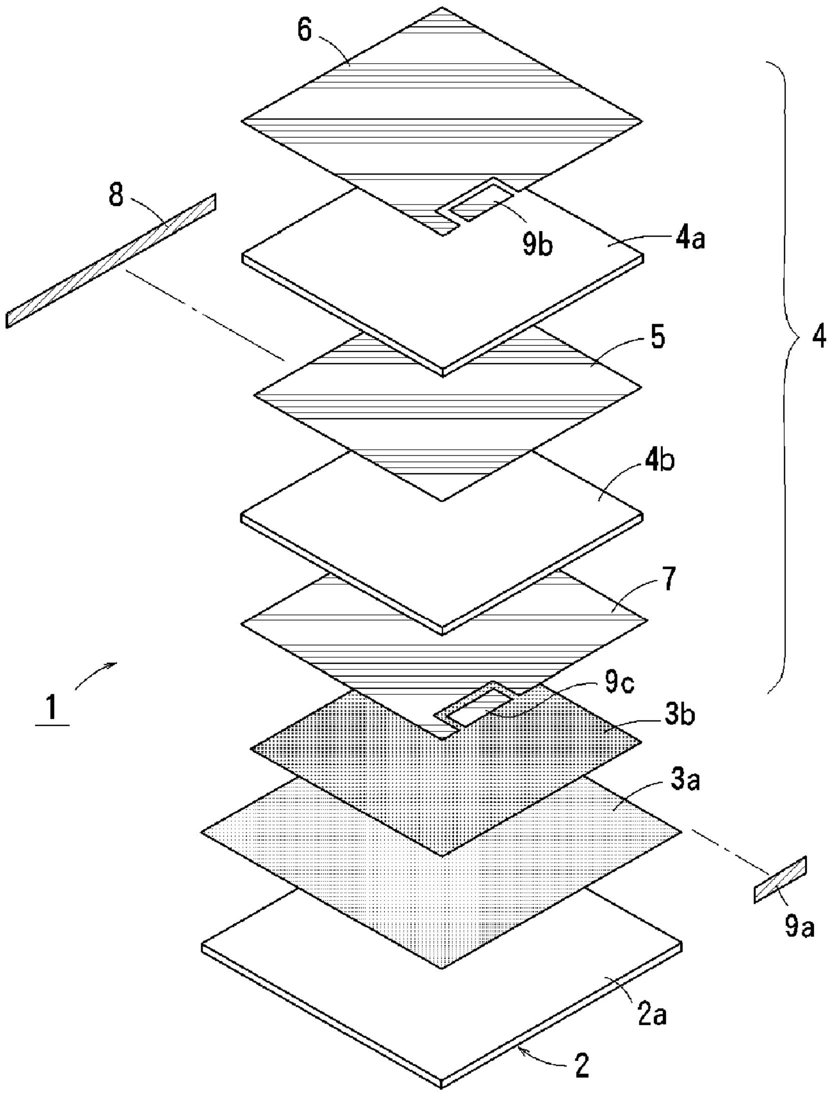
FIG. 2 is an exploded perspective view of a piezoelectric diaphragm used in the piezoelectric electroacoustic transducer in FIG. 1.
Figure 3:
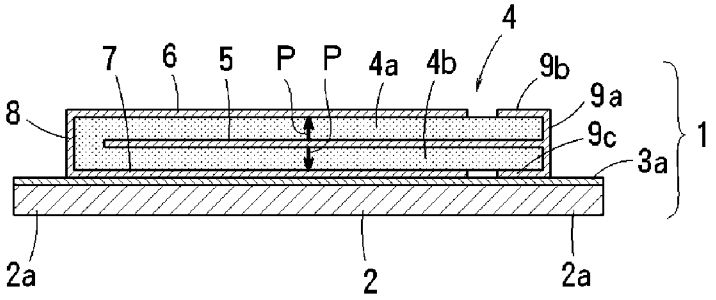
FIG. 3 is a sectional view of the piezoelectric diaphragm.
Figure 4:
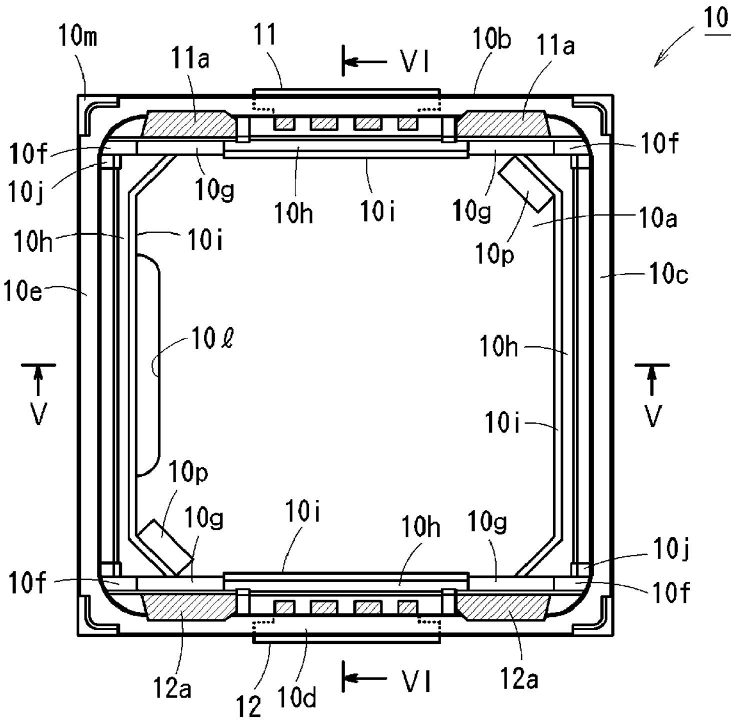
FIG. 4 is a plan view of a case used for the piezoelectric electroacoustic transducer in FIG. 1.
Figure 5:
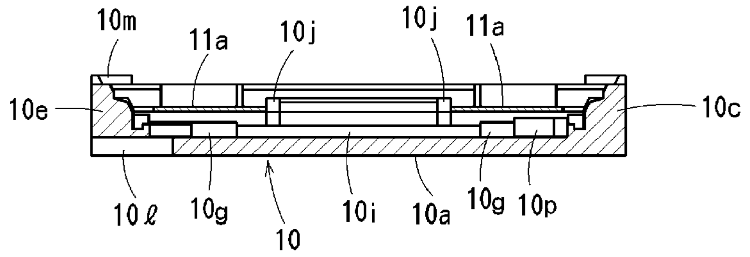
FIG. 5 is a sectional view taken along line V-V in FIG. 4.
Figure 6:
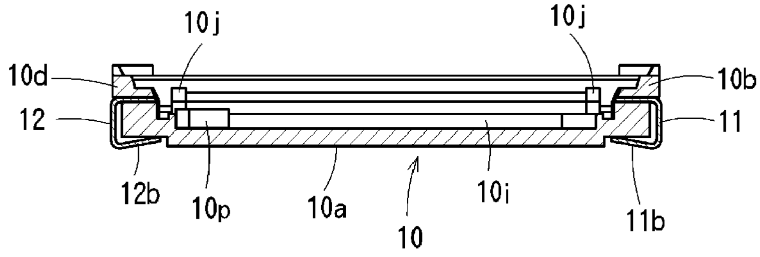
FIG. 6 is a sectional view taken along line VI-VI in FIG. 4.

Referring to FIGS. 2 and 3, the piezoelectric diaphragm 1 in this preferred embodiment includes a substantially square metal plate 2, an insulating layer 3*a* provided over a surface of the metal plate 2, and a substantially square piezoelectric element 4 bonded and fixed onto the insulating layer 3*a*. The piezoelectric element 4 is smaller than the metal plate 2. The metal plate 2 is preferably made of a material with spring elasticity, such as phosphor bronze and 42Ni alloy. The insulating layer 3*a* may be formed of a coating of resin, such as polyimide and epoxy, or an oxide film formed by oxidation.

The piezoelectric element 4 includes two piezoelectric ceramic layers 4*a* and 4*b*, an inner electrode 5 disposed there between, an outer electrode 6 disposed substantially over the entire top surface of the piezoelectric element 4, and another outer electrode 7 disposed substantially over the entire bottom surface of the piezoelectric element 4. The two piezoelectric ceramic layers 4*a* and 4*b* are preferably formed by co-firing green sheets with the inner electrode 5 disposed there between. These piezoelectric ceramic layers 4*a* and 4*b* are oppositely polarized in the thickness direction thereof, as indicated by the arrows P in FIG. 3. A side of the inner electrode 5 is exposed on an end surface of the piezoelectric element 4 while the opposite side of the inner electrode 5 is separated from the opposite end surface of the piezoelectric element 4 by a predetermined distance. The outer electrodes 6 and 7 of the piezoelectric element 4 are connected through a side electrode 8, while the inner electrode 5 is connected to a top lead electrode 9*b* and a bottom lead electrode 9*c* through another side electrode 9*a*. The lead electrodes 9*b* and 9*c* are small electrodes disposed along one side of the piezoelectric element 4 and electrically isolated from the outer electrodes 6 and 7. The side electrode 8 has a length that is substantially equivalent to one side of the piezoelectric element 4 while the other side electrode 9*a* has the length corresponding to those of the lead electrodes 9*b* and 9*c*. The lead electrodes 9*b* and 9*c* are disposed on the top and bottom surfaces, respectively, of the piezoelectric element 4 to eliminate the directionality of the piezoelectric element 4 in this preferred embodiment, although the bottom lead electrode 9*c* may be omitted. In addition, the lead electrodes 9*b* and 9*c* may have a length equivalent to one side of the piezoelectric element 4. The bottom surface of the piezoelectric element 4 is bonded to the center of the top surface of the insulating layer 3*a* preferably using an adhesive 3*b* (see FIG. 2), such as an epoxy adhesive, for example. The metal plate 2 is larger than the piezoelectric element 4, having an extended portion 2*a* extending to the outside of the piezoelectric element 4 and continuously covered with the insulating layer 3*a*.

Referring to FIGS. 4 to 10, the case 10 is made of a resin and preferably has a substantially rectangular box shape with a bottom wall 10*a* and four sidewalls 10*b* to 10*e*. The case 10 has a size of about 9 mm by about 9 mm by about 2 mm, for example. The resin is preferably a heat-resistant resin, such as a liquid crystal polymer (LCP), syndiotactic polystyrene (SPS), polyphenylene sulfide (PPS), and epoxy. Terminals 11 and 12 are inserted into the case 10 by insert molding. These terminals 11 and 12 have bifurcated inner connection portions 11*a* and 12*a*, respectively. The inner connection portions 11*a* and 12*a* are exposed inside the two opposed sidewalls 10*b* and 10*d*, respectively, of the four sidewalls 10*b* to 10*e*. The terminals 11 and 12 also have outer connection portions 11*b* and 12*b*, respectively, exposed outside the case 10. The outer connection portions 11*b* and 12*b* are bent toward the bottom surface of the case 10 along the outer surfaces of the sidewalls 10*b* and 10*d*, respectively (see FIG. 6).

Supports 10*f* are provided inside the four corners of the case 10 to support the bottom surface of the diaphragm 1 at the corners thereof. These supports 10*f* are arranged at a height that is one step lower than the exposed surfaces of the inner connection portions 11*a* and 12*a* of the terminals 11 and 12. When the diaphragm 1 is placed on the supports 10*f*, the top surface of the diaphragm 1 is located at substantially the same height as or slightly lower than the top surfaces of the inner connection portions 11*a* and 12*a* of the terminals 11 and 12.

Urethane-receiving steps 10*g* are provided near the supports 10*f* inside the inner connection portions 11*a* and 12*a* of the terminals 11 and 12. These urethane-receiving steps 10*g* are arranged at a height lower than the supports 10*f* to define predetermined gaps $D_1$ between the urethane-receiving steps 10*g* and the bottom surface of the diaphragm 1. The gaps $D_1$ between the top surfaces of the urethane-receiving steps 10*g* and the bottom surface of the diaphragm 1 (the top surfaces of the supports 10*f*) have a height such that a first elastic adhesive 13, described later, is prevented from flowing out by its surface tension. The gap $D_1$ is preferably about 0.1 mm to about 0.2 mm, for example, when the first elastic adhesive 13 has a viscosity of about 6 Pa·s to about 10 Pa·s. In this preferred embodiment, the gaps $D_1$ are about 0.15 mm, for example.

Grooves 10*h* to be filled with a second elastic adhesive 15, described later, are disposed on the periphery of the bottom wall 10*a* of the case 10. Flow-stopping walls 10*i* arranged lower than the supports 10*f* are disposed on the inner side of the grooves 10*h* to prevent the second elastic adhesive 15 from flowing onto the bottom wall 10*a*. The gaps $D_2$ between the top surfaces of the flow-stopping walls 10*i* and the bottom surface of the diaphragm 1 (the top surfaces of the supports 10*f*) are set such that the second elastic adhesive 15 is prevented from flowing out by its surface tension. The gaps $D_2$ are preferably about 0.15 mm to about 0.25 mm when the second elastic adhesive 15 has a viscosity of about 0.5 Pa·s to about 2.0 Pa·s. In this preferred embodiment, the gaps $D_2$ are about 0.20 mm, for example.

In this preferred embodiment, the bottom surfaces of the grooves 10*h* are arranged at a height that is above the top surface of the bottom wall 10*a*. The grooves 10*h* are shallow enough such that they can be fully filled with a relatively small amount of second elastic adhesive 15, and thus, the adhesive 15 can be quickly spread over the grooves 10*h*. Specifically, the height $D_3$ from the bottom surfaces of the grooves 10*h* to the bottom surface of the diaphragm 1 (the top surfaces of the supports 10*f*) is preferably set to about 0.30 mm, for example. The grooves 10*h* and the walls 10*i* are disposed along the periphery of the bottom wall 10*a* except where the urethane-receiving steps 10*g* are disposed, although the grooves 10*h* and the walls 10*i* may also be disposed over the entire periphery of the bottom wall 10*a* so as to continuously extend via the inside of the urethane-receiving steps 10*g*.

The grooves 10*h* have wide end portions (at the four corners) in contact with the supports 10*f* and the urethane-receiving steps 10*g*. These wide portions can accommodate an excess amount of the adhesive 15 to prevent the overflow thereof onto the top of the diaphragm 1.

Two overamplitude-preventing receivers 10*p* are disposed closer to the center of the piezoelectric diaphragm 1 than to the supports 10*f* to limit the amplitude of vibration of the diaphragm 1 to a predetermined range. These overamplitude-preventing receivers 10*p* are disposed at a corner of the bottom wall 10*a* of the case 10 near the lead electrode 9*b* and the diagonal corner thereof so as to protrude from the bottom wall 10*a*. In this preferred embodiment, the receivers 10*p* are adjacent to the inner peripheral side of the walls 10*i*. The receivers 10*p* are preferably arranged below areas where a conductive adhesive 14 is applied. The receivers 10*p* need not cover the entire areas where the conductive adhesive 14 is applied and may be disposed immediately below the ends of the areas facing the center of the diaphragm 1. The distance $D_4$ between the bottom surface of the diaphragm 1 and the top surfaces of the overamplitude-preventing receivers 10*p* is determined such that the diaphragm 1 does not come into contact with the receivers 10*p* during normal operation.

Figure 11A:
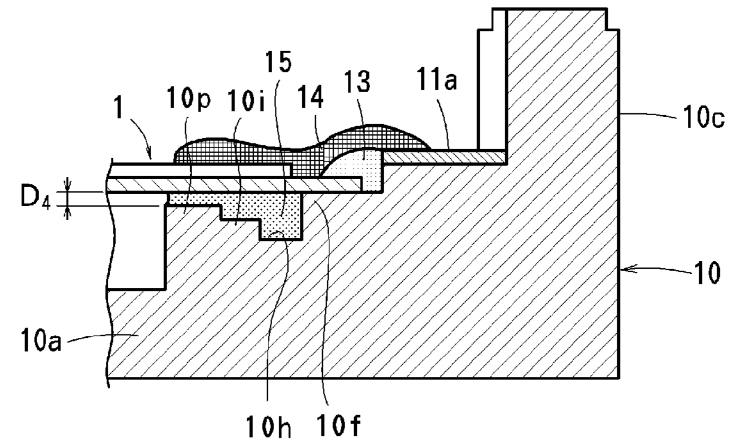
FIGS. 11A and 11B illustrate a sectional view taken along line XI-XI in FIG. 7 and a sectional view showing the action of an impact.
Figure 11B:
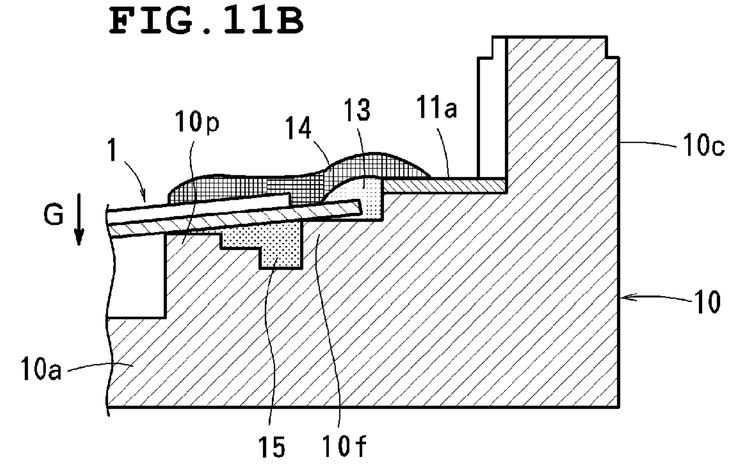

The distance $D_4$ is preferably about 0.01 mm to about 0.2 mm when the piezoelectric diaphragm 1 used includes a metal plate 2 having a size of about 7.6 mm by about 7.6 mm by about 0.03 mm and a piezoelectric element 4 having a size of about 6.8 mm by about 6.0 mm by about 0.04 mm and is supported at the four corners thereof. In this preferred embodiment, the distance $D_4$ is about 0.05 mm, and the receivers 10*p* have an area of about 0.36 $mm^2$, for example. The gaps between the diaphragm 1 and the overamplitude-preventing receivers 10*p* are filled with the second elastic adhesive 15 (see FIGS. 11A and 11B).

If an impact, for example, is applied to the piezoelectric sounder, an acceleration G bends the diaphragm 1 downward with the supports 10*f* as a fulcrum. The overamplitude-preventing receivers 10*p* limit excessive amplitude of vibration of the diaphragm 1 to avoid an excessive tension on the conductive adhesive 14, described later, thus preventing the cracking of the conductive adhesive 14. Even if the acceleration G is so large that the diaphragm 1 comes into contact with the receivers 10*p*, the second elastic adhesive 15 can softly receive the diaphragm 1 to avoid an excessive impact on the diaphragm 1, thus protecting the diaphragm 1.

Figure 12:
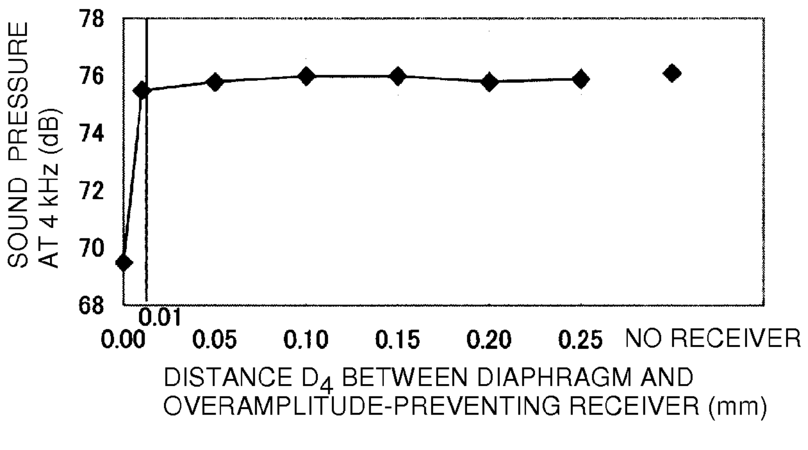
FIG. 12 is a graph showing the relationship between the distance $D_4$ between overamplitude-preventing receivers and the piezoelectric diaphragm and sound pressures at 4 kHz.

FIG. 12 is a graph showing the relationship between the distance $D_4$ between the receivers 10*p* and the diaphragm 1 and sound pressures at 4 kHz. FIG. 12 shows that sound pressures at 4 kHz of 75 dB or more are achieved with variations of only about 0.2 dB if the distance $D_4$ is adjusted to at least about 0.01 mm, for example. Thus the piezoelectric sounder has excellent sound pressure characteristics.

Figure 13:
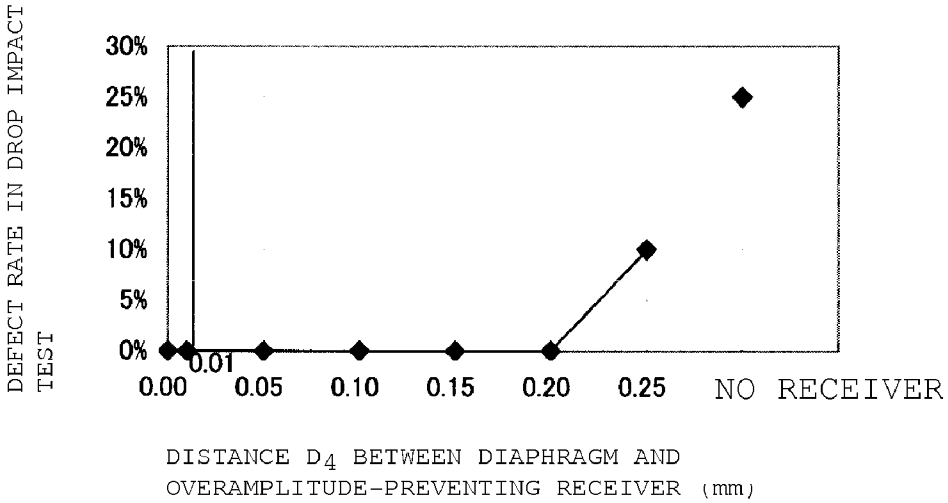
FIG. 13 is a graph showing the relationship between the distance $D_4$ between the overamplitude-preventing receivers and the piezoelectric diaphragm and defect rates in a drop impact test.
Figure 14A:
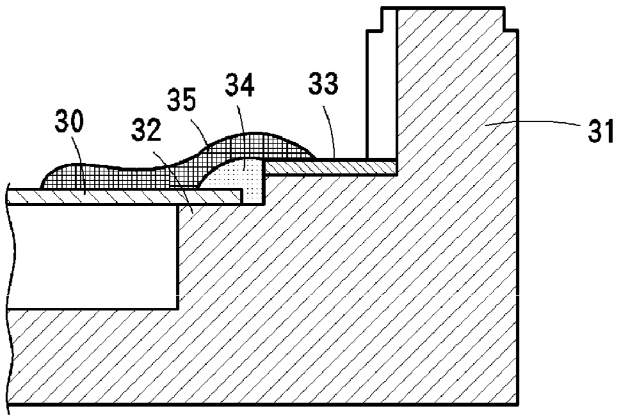
FIG. 14A PRIOR ART
FIGS. 14A and 14B illustrate sectional views of a connection portion between a piezoelectric diaphragm and a terminal in a known structure.
Figure 14B:
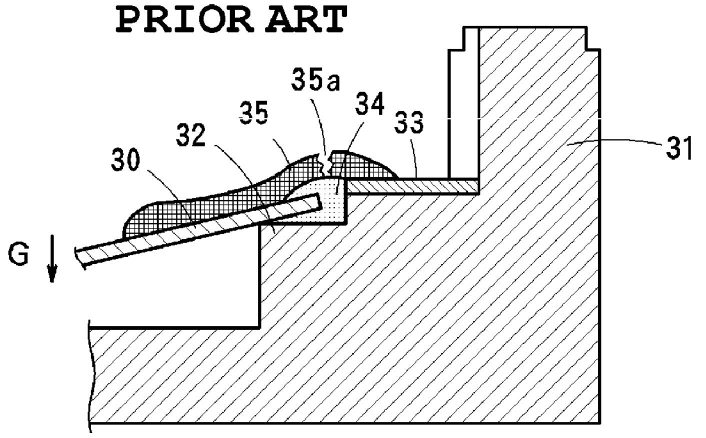
FIG. 14B PRIOR ART

FIG. 13 is a graph showing the relationship between the distance $D_4$ between the receivers 10*p* and the diaphragm 1 and defect rates in an impact test.

The impact test was performed by dropping cellular phones incorporating piezoelectric sounders onto a concrete surface from a height of about 150 cm and determining whether or not the conductive adhesive 14 was cracked after ten cycles of dropping in six directions/cycle. The piezoelectric sounders were determined to be defective if the conductive adhesive 14 was cracked.

FIG. 13 clearly shows that the defect rate remained 0% if the distance $D_4$ was about 0.2 mm or less and rose if the distance $D_4$ exceeded about 0.2 mm. These results demonstrate that the conductive adhesive 14 was cracked and exhibited decreased connection reliability if the distance $D_4$ exceeded about 0.2 mm.

Accordingly, the distance $D_4$ between the bottom surface of the diaphragm 1 and the top surfaces of the receivers 10*p* is preferably set in the range of about 0.01 mm to about 0.2 mm, for example.

Two tapered protrusions 10*j* are disposed on the inner surface of each of the sidewalls 10*b* to 10*e* to guide the four corners of the piezoelectric diaphragm 1.

Recesses 10*k* are provided at the inner top edges of the sidewalls 10*b* to 10*e* of the case 10 to prevent the second elastic adhesive 15 from climbing up the sidewalls 10*b* to 10*e*.

A first sound-emitting hole 10*l* is provided in the bottom wall 10*a* near the sidewall 10*e*.

Substantially L-shaped positioning protrusions 10*m* are provided at the corners of the top surfaces of the sidewalls 10*b* to 10*e* of the case 10 to fit to and hold the corners of the cover 20. The protrusions 10*m* have inner tapered surfaces 10*n* for guiding the cover 20.

The piezoelectric diaphragm 1 is incorporated in the case 10 with the metal plate 2 facing the bottom wall 10*a*. The supports 10*f* support the corners of the metal plate 2. The tapered protrusions 10*j*, which are disposed on the inner surfaces of the sidewalls 10*b* to 10*e*, guide the edges of the diaphragm 1 such that the corners thereof are accurately placed on the supports 10*f*. In particular, the tapered protrusions 10*j* allow a clearance between the diaphragm 1 and the case 10 to be narrowed with an accuracy that exceeds the accuracy with which the diaphragm 1 is inserted. This results in a smaller product size. In addition, the vibration of the diaphragm 1 is not obstructed because the contact areas between the protrusions 10*j* and the edges of the diaphragm 1 are small.

Figure 7:
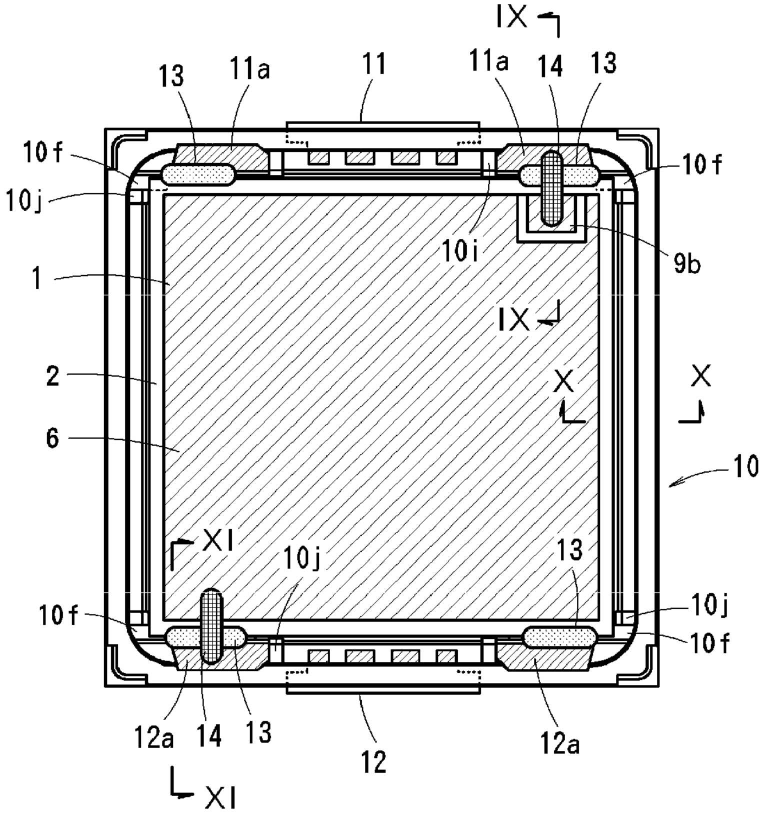
FIG. 7 is a plan view of the case in FIG. 4, which holds the diaphragm (before the application of a second elastic adhesive).
Figure 8:
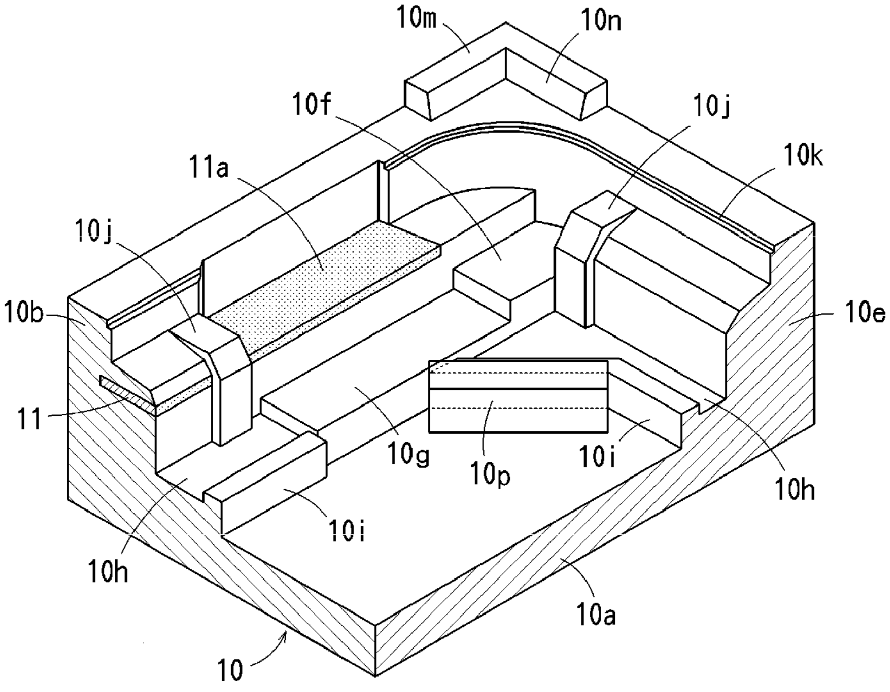
FIG. 8 is an enlarged perspective view of a corner of the case in FIG. 4.

After the diaphragm 1 is incorporated in the case 10, the first elastic adhesive 13 is applied to four places near the corners of the diaphragm 1 to secure the diaphragm 1 (particularly, the metal plate 2) to the inner connection portions 11*a* and 12*a* of the terminals 11 and 12, as shown in FIG. 7. That is, the first elastic adhesive 13 is applied to two diagonal locations, namely, between the lead electrode 9*b* and one of the inner connection portions 11*a* of the terminal 11 and between the top outer electrode 6 and one of the inner connection portions 12*a* of the terminal 12. The first elastic adhesive 13 is also preferably applied to the other two diagonal locations. The first elastic adhesive 13 is applied in a line in this preferred embodiment, although the shape thereof is not limited to the linear shape. The first elastic adhesive 13 preferably has a Young's modulus of about $500\times10^6$ Pa or less after being cured. A urethane adhesive having a Young's modulus of about $3.7\times10^6$ Pa is preferably used in this preferred embodiment. The applied first elastic adhesive 13 is cured by heating.

Figure 9:
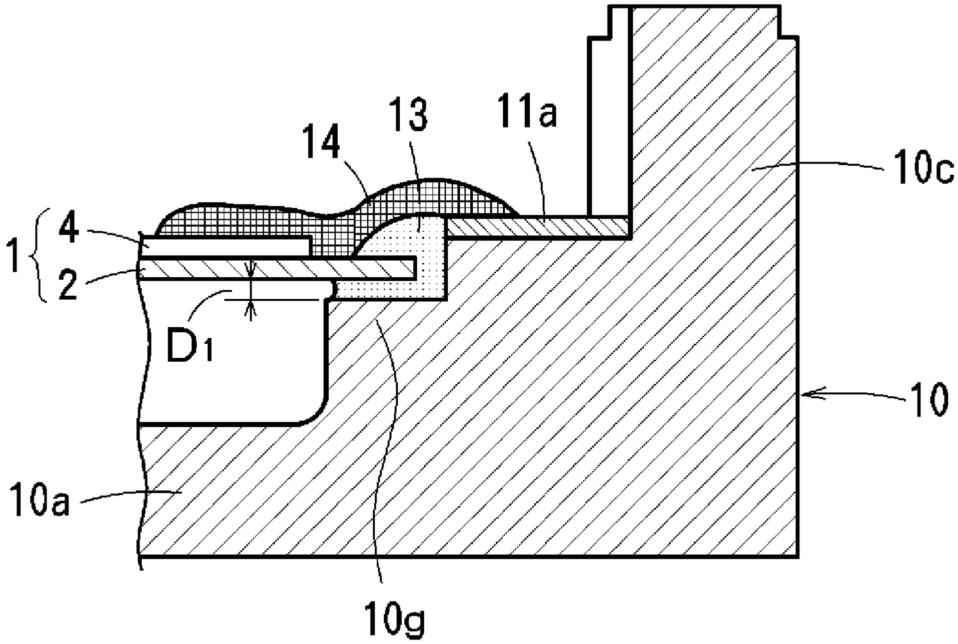
FIG. 9 is an enlarged sectional view taken along line IX-IX in FIG. 7.

The first elastic adhesive 13, when applied, may flow onto the bottom wall 10*a* through the gaps between the piezoelectric diaphragm 1 and the terminals 11 and 12 because of its low viscosity. As shown in FIG. 9, the urethane-receiving steps 10*g* are provided below the piezoelectric diaphragm 1 in the areas where the first elastic adhesive 13 is applied. The gaps $D_1$ between the urethane-receiving steps 10*g* and the piezoelectric diaphragm 1 are so narrow that the first elastic adhesive 13 is prevented from flowing onto the bottom wall 10*a* by its surface tension. In addition, the gaps $D_1$ are quickly filled with the first elastic adhesive 13, and an excess thereof forms bumps between the piezoelectric diaphragm 1 and the terminals 11 and 12. The piezoelectric diaphragm 1 is not excessively restrained because the elastic adhesive 13 forms a layer filling the gaps $D_1$ between the urethane-receiving steps 10*g* and the piezoelectric diaphragm 1.

After the first elastic adhesive 13 is cured, the conductive adhesive 14 is applied across the first elastic adhesive 13. The specific conductive adhesive 14 is not particularly limited. A urethane-based conductive paste having a Young's modulus after curing of about $0.3\times10^9$ Pa is preferably used in this preferred embodiment. The applied conductive adhesive 14 is cured by heating to connect the lead electrode 9*b* to the inner connection portion 11*a* of the terminal 11 and to connect the top outer electrode 6 to the inner connection portion 12*a* of the terminal 12. The conductive adhesive 14 is also applied to the metal plate 2, but does not come into direct contact therewith because the insulating layer 3*a* is disposed on the metal plate 2 in advance, and the first elastic adhesive 13 covers the edges of the metal plate 2. The shape of the applied conductive adhesive 14 is not particularly limited, and may be any shape that allows the conductive adhesive 14 to connect the lead electrode 9*b* to the inner connection portion 11*a* and to connect the outer electrode 6 to the inner connection portion 12*a* via the top surfaces of the first elastic adhesive 13. The conductive adhesive 14 is applied in the shape of an arch across the top surfaces of the bumps of the first elastic adhesive 13, thus extending along the shortest route (see FIG. 9). The first elastic adhesive 13 relieves a stress due to the curing and contraction of the conductive adhesive 14 to reduce the effect thereof on the piezoelectric diaphragm 1.

After the conductive adhesive 14 is applied and cured, the second elastic adhesive 15 is applied into the gaps between the entire periphery of the diaphragm 1 and the inner portion of the case 10 to prevent air from leaking from the spaces above and below the diaphragm 1 to each other. The second elastic adhesive 15 applied around the diaphragm 1 is cured by heating. The second elastic adhesive 15 is preferably a thermosetting adhesive having a Young's modulus of about $30\times10^6$ Pa or less after being cured and having a low viscosity, such as about 0.5 Pa-s to about 2 Pa-s, before being cured. A silicone adhesive having a Young's modulus of about $3.0\times10^5$ Pa is preferably used in this preferred embodiment.

Figure 10:
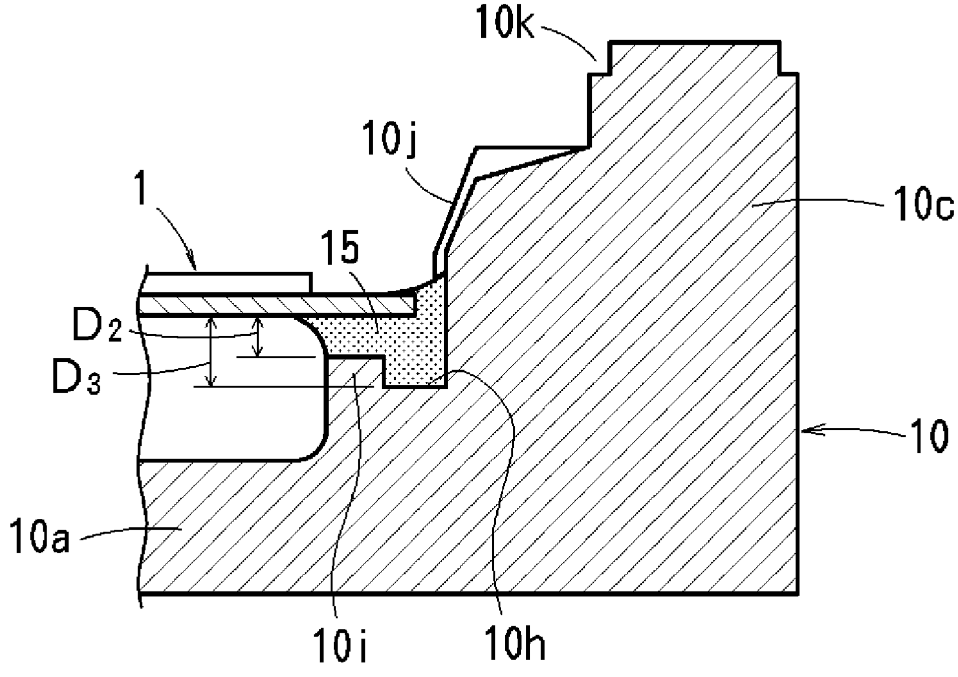
FIG. 10 is an enlarged sectional view taken along line X-X in FIG. 7.

The second elastic adhesive 15, when applied, may flow onto the bottom wall 10*a* through the gaps between the piezoelectric diaphragm 1 and the case 10 because of its low viscosity. As shown in FIG. 10, the grooves 10*h*, which are to be filled with the second elastic adhesive 15, are defined on the inner portion of the case 10 opposite the periphery of the diaphragm 1, and the flow-stopping walls 10*i* are disposed on the inner side of the grooves 10*h*. The second elastic adhesive 15 flows into and spreads over the grooves 10*h*. The gaps $D_2$ are defined between the diaphragm 1 and the flow-stopping walls 10*i* such that the second elastic adhesive 15 is maintained in the gaps $D_2$ by its surface tension. Thus, the gaps $D_2$ prevent the second elastic adhesive 15 from flowing onto the bottom wall 10*a*. In addition, the elastic adhesive 15 forms a layer filling the gaps $D_2$ between the walls 10*i* and the piezoelectric diaphragm 1 to prevent the vibration of the piezoelectric diaphragm 1 from being restrained.

The gaps $D_2$ are slightly larger than the gaps $D_1$ ($D_1$=0.05 mm and $D_2$=0.15 mm) in this preferred embodiment. The first elastic adhesive 13 is applied to portions of the piezoelectric diaphragm 1, that is, to only the opposite portions of the piezoelectric diaphragm 1 and the terminals 11 and 12, while the second elastic adhesive 15 is applied substantially over the entire periphery of the piezoelectric diaphragm 1. To minimize the binding force of the second elastic adhesive 15 on the piezoelectric diaphragm 1, the gaps $D_2$ are maximized within a range such that the second elastic adhesive 15 does not leak. The binding force of the first elastic adhesive 13, which is applied to the limited areas, has little effect even if the gaps $D_1$ are reduced. The gaps $D_1$ are therefore defined so as to minimize the amount of adhesive 13 used to form the bumps between the piezoelectric diaphragm 1 and the terminals 11 and 12.

A portion of the applied second elastic adhesive 15 may climb up and adhere to the top surfaces of the sidewalls. If the second elastic adhesive 15 is a sealant having mold release properties, such as a silicone adhesive, the adhesive 15 can decrease the bonding strength with which the cover 20 is bonded to the top surfaces of the sidewalls 10*b* to 10*e*. Therefore, the recesses 10*k* are provided at the inner top edges of the sidewalls 10*b* to 10*e* to prevent the second elastic adhesive 15 from climbing up and adhering to the top surfaces of the sidewalls.

After the diaphragm 1 is attached to the case 10 as described above, the cover 20 is bonded to the top surfaces of the sidewalls 10*b* to 10*e* of the case 10 with an adhesive 21. The adhesive 21 may be a known adhesive, such as an epoxy adhesive. A silicone adhesive may be used as the adhesive 21 if the second elastic adhesive 15 used is a silicone adhesive because the adhesive can produce siloxane gas and deposit a coating thereof on the top surfaces of the sidewalls 10*b* to 10*e* of the case 10. The cover 20 is preferably made of a material similar to the material for the case 10 and has a flat shape. The cover 20 is accurately positioned by allowing the edges thereof to engage with the tapered surfaces 10*n* of the positioning protrusions 10*m* on the top surfaces of the sidewalls 10*b* to 10*e* of the case 10. The cover 20 is bonded to the case 10 to define an acoustic space between the cover 20 and the diaphragm 1. The cover 20A has a second sound-emitting hole 22.

Thus, a surface-mount piezoelectric electroacoustic transducer is produced.

In this preferred embodiment, a predetermined periodic voltage (alternating signals or rectangular signals) is applied across the terminals 11 and 12 to expand and contract the piezoelectric element 4 in a plane, while the metal plate 2 does not expand or contract. The diaphragm 1 can thus be bent and vibrated as a whole. The diaphragm 1 emits a predetermined sound wave through the sound-emitting hole 22 because the second elastic adhesive 15 seals the spaces above and below the diaphragm 1.

In particular, the diaphragm 1 produces a higher sound pressure because the supports 10*f* support the diaphragm 1 at the corners thereof with a small supporting area. In addition, the electroacoustic transducer has stable frequency characteristics because the first elastic adhesive 13 is disposed below the conductive adhesive 14 to prevent a strain imposed on the diaphragm 1 by a stress due to the curing and contraction of the conductive adhesive 14. Furthermore, the cured conductive adhesive 14 does not obstruct the vibration of the diaphragm 1 and is not cracked by the vibration of the diaphragm 1.

The present invention is not limited to the preferred embodiment described above and may be modified within the scope of the present invention.

The area at which the second elastic adhesive 15 is applied is not limited to the entire periphery of the diaphragm 1 as in the preferred embodiment described above, and it may be applied to any area at which it can seal the gaps between the diaphragm 1 and the case 10.

Although the piezoelectric diaphragm 1 has a structure including the metal plate and the multilayer piezoelectric element 4 bonded thereto in this preferred embodiment, the piezoelectric element used may also have a monolayer structure.

The piezoelectric diaphragm of the present invention is not limited to a unimorph piezoelectric diaphragm including a metal plate and a piezoelectric element bonded thereto, and a bimorph piezoelectric diaphragm including only a multilayer piezoelectric ceramic element as disclosed in Japanese Unexamined Patent Application Publication No. 2001-95094 may be used.

The casing of the present invention is not limited to the casing including the case 10, which preferably has a substantially box shaped cross section, and the cover 20, which is bonded to the top opening of the case 10, in the preferred embodiment described above. For example, the casing may include a cap-like case with a bottom opening and a substrate bonded to the bottom of the case.

The receivers 10*p* are preferably disposed at the two diagonal locations in the preferred embodiment described above, although the number of the receivers 10*p* may be increased according to the locations at which the conductive adhesive 14 is applied.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A piezoelectric electroacoustic transducer comprising:

a piezoelectric diaphragm that is supplied with a periodic signal across electrodes thereof to bend and vibrate in a thickness direction;

a casing including supports on an inner portion thereof to support four corners of a bottom surface of the piezoelectric diaphragm;

terminals fixed to the casing, each having an inner connection portion exposed near the supports;

a first elastic adhesive disposed between a periphery of the piezoelectric diaphragm and the inner connection portions of the terminals to secure the piezoelectric diaphragm to the casing;

a conductive adhesive disposed between the electrodes of the piezoelectric diaphragm and the inner connection portions of the terminals across a top surface of the first elastic adhesive to electrically connect the electrodes of the piezoelectric diaphragm to the inner connection portions of the terminals;

a second elastic adhesive filling and sealing a gap between the periphery of the piezoelectric diaphragm and the inner portion of the casing; and an overamplitude-preventing receiver disposed on the casing to limit an amplitude of vibration of the piezoelectric diaphragm to a predetermined range; wherein the overamplitude-preventing receiver includes a tor surface that is arranged at a height lower than the supports and below an area in which the conductive adhesive is applied, such that a gap is provided between the top surface of the overamplitude-preventing receiver and the bottom surface of the piezoelectric diaphragm; and the second elastic adhesive fills the gap between the bottom surface of the piezoelectric diaphragm and the top surface of the overamplitude-preventing receiver.

2. The piezoelectric electroacoustic transducer according to claim 1, wherein a distance between the bottom surface of the piezoelectric diaphragm and the top surface of the overamplitude-preventing receiver is about 0.01 mm to about 0.2 mm.

3. The piezoelectric electroacoustic transducer according to claim 1, wherein the first elastic adhesive has a Young's modulus of about $500\times10^6$ Pa or less after being cured and the second elastic adhesive has a Young's modulus of about $30\times10^6$ Pa or less after being cured.

4. The piezoelectric electroacoustic transducer according to claim 1, wherein the first elastic adhesive is a urethane adhesive, and the second elastic adhesive is a silicone adhesive.

5. The piezoelectric electroacoustic transducer according to claim 1, wherein the piezoelectric diaphragm includes two piezoelectric ceramic layers, and the electrodes include an inner electrode disposed between the two piezoelectric ceramic layers, an outer electrodes disposed on top and bottoms surfaces of the piezoelectric diaphragm.

6. The piezoelectric electroacoustic transducer according to claim 5, wherein the outer electrodes are disposed substantially over the entire top and bottom surfaces of the piezoelectric diaphragm.

7. The piezoelectric electroacoustic transducer according to claim 1, wherein the casing is made of a heat-resistant resin.

8. The piezoelectric electroacoustic transducer according to claim 7, wherein the heat-resistant resin is selected from the group consisting of liquid crystal polymer, syndiotactic polystyrene, polyphenylene sulfide and epoxy.

9. The piezoelectric electroacoustic transducer according to claim 1, wherein the supports of the casing support only the four corners of the bottom surface of the piezoelectric diaphragm.

10. The piezoelectric electroacoustic transducer according to claim 1, wherein the casing further includes adhesive-receiving steps disposed at a height below the supports of the casing to receive the first elastic adhesive.

11. The piezoelectric electroacoustic transducer according to claim 1, wherein the conductive adhesive has a Young's modulus of about $0.3\times10^9$ after curing.

12. The piezoelectric electroacoustic transducer according to claim 1, wherein the casing includes grooves disposed around a periphery of the inner portion of the casing to receive the second elastic adhesive.

13. The piezoelectric electroacoustic transducer according to claim 12, wherein the casing includes tapered protrusions on inner surfaces of each sidewall of the casing.

* * * * *